(12) United States Patent
Stevenson et al.

(10) Patent No.: US 7,151,844 B2
(45) Date of Patent: Dec. 19, 2006

(54) IMAGE SENSOR METHOD AND APPARATUS HAVING HARDWARE IMPLEMENTED EDGE DETECTION PROCESSING

(75) Inventors: Charles Neil Stevenson, Brookfield, CT (US); Ronald Michael Lesperance, Troy, MI (US); Frank J. Schauerte, Berkley, MI (US); John Richard Troxell, Sterling Heights, MI (US)

(73) Assignee: General Motors Corporation, Detroit, MI (US)

( * ) Notice: Subject to any disclaimer, the term of this patent is extended or adjusted under 35 U.S.C. 154(b) by 651 days.

(21) Appl. No.: 10/011,172

(22) Filed: Dec. 6, 2001

(65) Prior Publication Data

US 2003/0108221 A1      Jun. 12, 2003

(51) Int. Cl.
*G06K 9/00* (2006.01)
(52) U.S. Cl. ............... 382/104; 382/260; 382/264; 382/266; 382/199
(58) Field of Classification Search ........ 382/103–104, 382/199, 205, 260–269; 701/1, 200–226, 701/300–302; 280/81.6
See application file for complete search history.

(56) References Cited

U.S. PATENT DOCUMENTS

| | | | | |
|---|---|---|---|---|
| 4,399,461 A | * | 8/1983 | Powell | 348/625 |
| 4,442,454 A | * | 4/1984 | Powell | 348/618 |
| 4,805,031 A | * | 2/1989 | Powell | 358/463 |
| 5,089,983 A | | 2/1992 | Chiang | 708/838 |
| 5,296,696 A | | 3/1994 | Uno | 250/208.1 |
| 5,471,515 A | | 11/1995 | Fossum et al. | 377/60 |
| 5,880,460 A | | 3/1999 | Merrill | 250/208.1 |
| 5,909,026 A | | 6/1999 | Zhou et al. | 250/208.1 |
| 5,949,483 A | * | 9/1999 | Fossum et al. | 348/303 |
| 5,949,910 A | * | 9/1999 | Go | 382/233 |
| 5,990,506 A | | 11/1999 | Fossum et al. | 257/294 |
| 6,021,172 A | | 2/2000 | Fossum et al. | 377/60 |
| 6,055,340 A | * | 4/2000 | Nagao | 382/261 |
| 6,180,937 B1 | | 1/2001 | Troxell et al. | 250/214.1 |
| 6,239,847 B1 | * | 5/2001 | Deierling | 348/581 |
| 6,320,934 B1 | * | 11/2001 | Carroll et al. | 378/98.8 |

(Continued)

OTHER PUBLICATIONS

Rafael C. Gonzalez, Richard E. Woods, "Digital Image Processing", Addison-Wesley Publishing Company, 1992, pp. 189-200 and 416-420.*

(Continued)

*Primary Examiner*—Bhavesh M. Mehta
*Assistant Examiner*—John B. Strege
(74) *Attorney, Agent, or Firm*—Kathryn A. Marra

(57) ABSTRACT

An image sensor comprising an integrated circuit chip that includes both a pixel array and edge detection circuitry hardwired together on the chip. The pixel array provides an addressable, non-destructive readout of the pixel data, with the edge detection circuit providing a hardwired implementation of a pair of n×n masks that are convolved with the pixel array data to thereby generate horizontal and vertical edge data that is combined together and outputted by the image sensor. The masks are implemented as a pair of one-dimensional filters, with one of the filters being a one-dimensional Gaussian filter used to smooth the pixel data along one axis and the other filter providing a first derivative Gaussian function to detect edges along the other, orthogonal axis. The non-destructibility of the readout from the pixel array eliminates the need for buffering large amounts of pixel data and the use of separable, one-dimensional filters permits each mask to be implemented using only n simultaneous outputs from the array, 2n weights, and n−1 buffers for temporary storage of the smoothed pixel data.

26 Claims, 4 Drawing Sheets

U.S. PATENT DOCUMENTS 6,711,293 B1 * 3/2004 Lowe .................... 382/219
6,754,394 B1 * 6/2004 Boliek et al. ............ 382/240
6,778,212 B1 * 8/2004 Deng et al. ............. 348/222.1

OTHER PUBLICATIONS

Image Sensor Method and Apparatus Having Addressable Pixels and Non-Destructive Readout, Charles Neil Stevenson, filed concurrently with this application.

Blicher, "Edge Detection and Geometric Methods in Computer Vision", Department of Computer Science, Stanford University, 1984.

Marr and Hildreth, "Theory of Edge Detection", *Proc. Royal Society London*, B207, pp. 187-217 (1980).

Canny, "A Computational Approach to Edge Detection", IEEE Trans. Pattern Analysis and Machine Intelligence, vol. PMAI-8, No. 6, Nov. 1986.

Bracewell, *The Fourier Transform and its Applications*, pp. 160-163, McGraw-Hill, 1965.

Chiang and Chuang, "A CCD Programmable Image Processor and its Neural Network Applications," *IEEE Journal of Solid-State Circuits*, vol. 26, No. 12, pp. 1894-1901, Dec. 1991.

Mendis, Kemeny, & Fossum, "CMOS Active Pixel Sensor", *IEEE Transactions on Electron Devices*, vol. 41, No. 3, pp. 452-453 (1994).

* cited by examiner

IMAGE SENSOR METHOD AND APPARATUS HAVING HARDWARE IMPLEMENTED EDGE DETECTION PROCESSING

TECHNICAL FIELD

The invention relates generally to edge detection in machine vision applications and, more particularly, to automotive lane tracking safety systems using image sensors and edge detection algorithms to identify lane markings.

BACKGROUND OF THE INVENTION

Various forward obstruction warning, road departure warning, and blind spot monitoring systems have been proposed that are intended for use during vehicle operation. Lane tracking and road departure warning systems can use any of a number of different technology approaches to determine the vehicle's position within the boundaries of a section of roadway. One approach is to use a camera or, more generally, an image sensor that monitors the road on one or both sides of the vehicle in an effort to recognize lane markings. The location of the lane markings in a highway image can be distinguished from the background pattern of the road by sharp discontinuities in the local light intensity, commonly referred to as edges. An essential goal of these optically-based tracking and warning systems is the early identification or detection of sharp intensity changes in regions of the image where lane markings are likely to occur.

Apart from their use for lane tracking and road departure warning, these sensing systems can be used for other purposes. For example, in forward obstruction warning systems, radar may lack the ability to resolve ambiguities in range measurements. Consider a driving condition as illustrated in FIG. 1. As the car at the bottom of the figure begins to traverse the curve, its forward looking radar system may incorrectly detect a car rounding the curve in the opposite direction as an imminent obstruction. Thus, it will be appreciated that an obstruction warning system may require both lane and boundary projection, and vehicle trajectory estimation, in order to correctly interpret a driving situation such as that illustrated in FIG. 1.

In optical sensing systems used for vehicle systems of the types noted above, edge detection is carried out by suitable processing of the image data received from the image sensor. As is known, edge detection algorithms can be implemented using either a local differencing operation or a global optimization technique. See, for example, Blicher, "Edge Detection and Geometric Methods in Computer Vision," Department of Computer Science, Stanford University, 1984. Local techniques have some advantage over global methods because they can be more efficiently implemented in analog or digital hardware. Local algorithms are implemented by convolving the image array with a mask, which is a smaller matrix containing the filter coefficients.

As indicated by FIG. 2, mask operators are said to slide over the image as the computation proceeds. This graphic imagery is intended to indicate that the limits on a local summation, representing the convolution of the mask with the image data, change as the output is computed at different points in the image. The mask output at point (i,j) in the image can be computed using an n×n mask as a weighted sum of all the image intensity values in the local region around the point (i,j). If I(i,j) is the intensity at (i,j) and w(l,m) are the mask values, then O(i,j) is the output of the mask at (i,j):

$$O(i,j) = \sum_{l=0}^{n-1} \sum_{m=0}^{n-1} I\left(i - \frac{n}{2} + l, j - \frac{n}{2} + m\right) \cdot w(l,m) \quad (1)$$

The division n/2 is modulo 2, so that odd numbers are rounded down. The two summations in this equation require $n^2$ multiplications to complete. Two masks are required because edges are described using an orthogonal decomposition of two parameters, typically either rectilinear or polar coordinates.

The best local edge detection operations incorporate a smoothing or filtering function to reduce the effect of noise and visual artifacts before the differencing is done to find local discontinuities in the intensity. Marr and Hildreth, "Theory of Edge Detection," Proc. Royal Society London, B 207, pp. 187–217 (1980), teaches that such a smoothing operation should be localized in both the spatial domain and in the frequency domain. As shown by Canny, "A Computational Approach to Edge Detection," IEEE Trans. Pattern Analysis and Machine Intelligence, Vol. PAMI-8, No. 6, November 1986, there is a direct trade-off between noise suppression and the ability of the edge detection algorithm to identify the center of the edge.

The requirements for localization in both the frequency and spatial domains are in direct conflict because of interdependence of time and frequency, which places a lower bound on the time-bandwidth product. According to Bracewell, The Fourier Transform and its Applications, McGraw-Hill, 1965, the only function that can achieve the theoretical minimum for the time-bandwidth product is a Gaussian function. As a direct consequence, most local edge detection algorithms use a discrete approximation to a Gaussian function for their smoothing operations, as suggested by [Marr and Hildreth].

In 1983, [Canny] showed that the first derivative of a Gaussian function permitted separability between the smoothing and edge detection functions and yet was close to the theoretical best compromise between noise suppression and edge location. The [Canny] approach begins by smoothing the entire image with a Gaussian smoothing function. A complete second image, or at least a local buffer, must be constructed where each smoothed value, S(i,j), is computed according to:

$$S(i,j) = G(i,j,\sigma) I(i,j) \quad (2)$$

where $G(i,j,\sigma)$ is a Gaussian smoothing function with radius $\sigma$ and I(i,j) is the image. The directional edges are then computed using finite differences:

$$\frac{\partial}{\partial x} S(i,j) = ((S(i+1,j) - S(i,j)) + (S(i+1,j+1) - S(i,j+1)))/2 \quad (3)$$

$$\frac{\partial}{\partial y} S(i,j) = ((S(i,j) - S(i,j-1)) + (S(i+1,j) - S(i+1,j+1)))/2 \quad (4)$$

As will be appreciated, edge detection is a significant computational task. For an n×n filter, where n would typically be three, five, or seven, edge detection at each pixel would involve $n^2$ multiplications followed by a sum of products. If a five by five operation is performed at each pixel in a large image, say 400×600, with two orthogonal edge detections at each pixel, some $12 \times 10^6$ multiplications are required.

Because of this computational complexity, many machine vision systems employ custom or special purpose hardware for edge detection. The financial cost of this special purpose hardware has resulted in considerable research into analog processing circuits that can be incorporated onto the image sensor chip. See, for example, Chiang and Chuang, "A CCD Programmable Image Processor and its Neural Network Applications," *IEEE Journal of Solid-State Circuits*, Vol. 26, No. 12, pp. 1894–1901, December 1991, and U.S. Pat. No. 5,089,983 to Chiang. However, not all edge detection algorithms are easily implemented in hardware on the sensor chip. For example, the [Canny] approach described above has the same requirements for image buffers as many other algorithms that have been developed for software implementations using, for example, a frame-based image processing board, and this renders it impractical for hardwired integration onto the sensor chip. Where only localized filtering is used, the number of buffers can be reduced. For example, [Chiang and Chuang] disclose a custom analog image processing chip designed to implement a 7×7 mask, with programmable weights, on an image with 128 columns. The CCD image sensor provides a readout of sequential rows. A 7×7 mask would simultaneously require image data from seven different rows, necessitating the buffering of at least six complete rows of image data. While this is a significant reduction from the whole image buffering required for an algorithm such as [Canny] that uses global smoothing, it nonetheless still involves the buffering of large amounts of data from the CCD sensor which requires a large amount of expensive chip area.

Furthermore, CCD technology is not entirely compatible with standard CMOS process, and many CMOS circuit elements cannot be reliably manufactured with a CCD process. In the past, image sensor manufacturers have been unable to include many standard CMOS circuit elements in their sensors because the circuits and the CCD buried channel process are incompatible. More recently, active pixel sensor (APS) imagers have been proposed in which the image sensor itself is manufactured using a CMOS process. See, for example, Mendis, Kemeny, & Fossum, "CMOS Active Pixel Sensor," *IEEE Transactions on Electron Devices*, Vol. 41, No. 3, pp. 452–453 (1994), and U.S. Pat. Nos. 5,471,515 and 6,021,172 issued to E. R. Fossum et al. While APS imagers of the type noted above can be combined with other CMOS circuitry, and while they provide a pixel array that is independently addressable on a row and column basis, they do not provide a non-destructive readout of data, meaning that the data can only be read once. Since certain signal processing algorithms require multiple use of selected portions on the pixel array, the pixel data must be buffered or otherwise stored, as is done in [Chiang and Chuang], so that the data can be accessed as many times as required by the algorithm. Again, this increases the complexity, size, and corresponding expense of the resulting chip.

Accordingly, it is a general object of the invention to provide an image sensor that includes built-in edge detection circuitry. It is also an object of the invention to provide such an image sensor that is built using a CMOS process with an addressable, non-destructive readout of pixel data and one or more hardware-implemented masks for processing the pixel data to detect edges in the image.

SUMMARY OF THE INVENTION

The present invention is directed to an image sensor and associated method used for sensing an image and outputting image data that identifies edges contained within the image. The image sensor includes a pixel array and an edge detection circuit that comprises a pair of filters to smooth the raw pixel data in one direction and then detect edges in the other, orthogonal direction. The pixels within the array are individually addressable and provide a non-destructive readout of the pixel data. The smoothing filter circuit is connected to the array via one or more inputs that receive pixel data from a plurality of the pixels. The second filter is a differencing filter circuit having an input coupled to the output of said smoothing filter circuit to receive the filtered pixel data. It detects any edges contained within the group of filtered pixels and outputs image data that identifies those edges.

The image sensor enables edge detection using a highly efficient hardware circuit that minimizes the number of buffers required. The two filter circuits comprise hardwired implementations of an edge detection mask that is convolved with the image data. The image sensor operates to detect edges within an image by first sensing the image using the image sensor and thereafter carrying out the following steps for each of a number of selected pixels using a localized (e.g., n×n) group of pixels surrounding each selected pixel:

(1) accessing a one-dimensional set of pixels contained within the localized group of pixels;

(2) reading the data values associated with the pixels accessed in step (1);

(3) determining an intermediate data value using a smoothing function that is applied to the data values read in step (2);

(4) repeating steps (1) through (3) for each of the one-dimensional sets of pixels contained within the localized group to thereby produce a set of said intermediate data values; and (5) determining a final data value for the selected pixel using a differencing function that is applied to the set of intermediate data values.

Preferably, the smoothing function is a one-dimensional Gaussian function and the differencing function is a one-dimensional, first derivative Gaussian function.

The image sensor and method of the invention can advantageously be used in special purpose machine vision applications where it is desirable to incorporate the hardwired edge detection circuitry on the image sensor chip itself. Such applications include lane tracking and road departure warning systems, as well as forward obstruction warning systems that could benefit from lane tracking to resolve ambiguities in radar or other sensor data.

BRIEF DESCRIPTION OF THE DRAWINGS

A preferred exemplary embodiment of the invention will hereinafter be described in conjunction with the appended drawings, wherein like designations denote like elements, and wherein.

DETAILED DESCRIPTION OF THE PREFERRED EMBODIMENT

Figure 1:
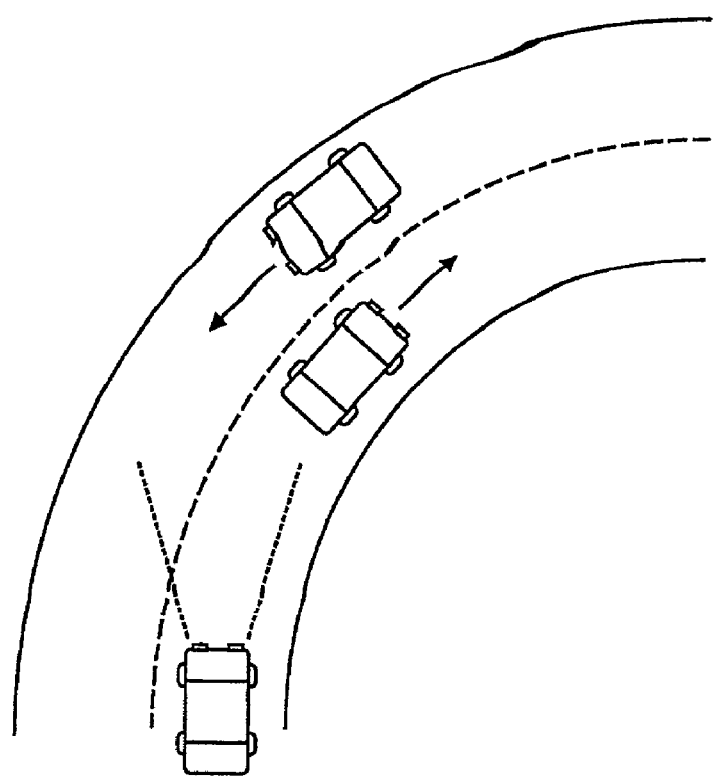
FIG. 1 is a top view of typical traffic condition illustrated for purposes of discussing the limitations of simple radar-based forward obstruction warning systems.
Figure 2:
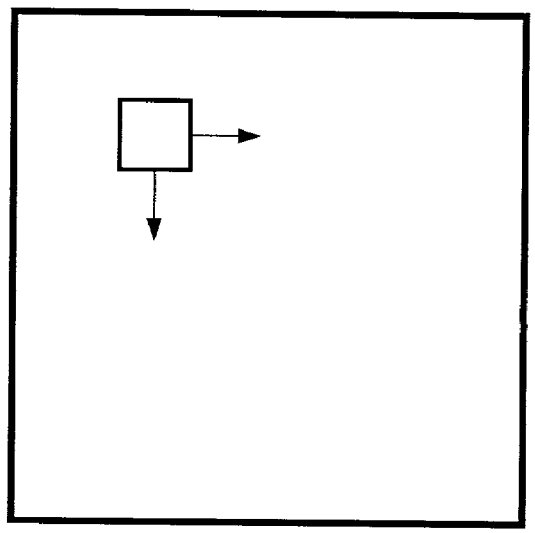
FIG. 2 is a diagrammatic view graphically illustrating the technique for convolving a mask with an image for purposes of image processing.
Figure 3:
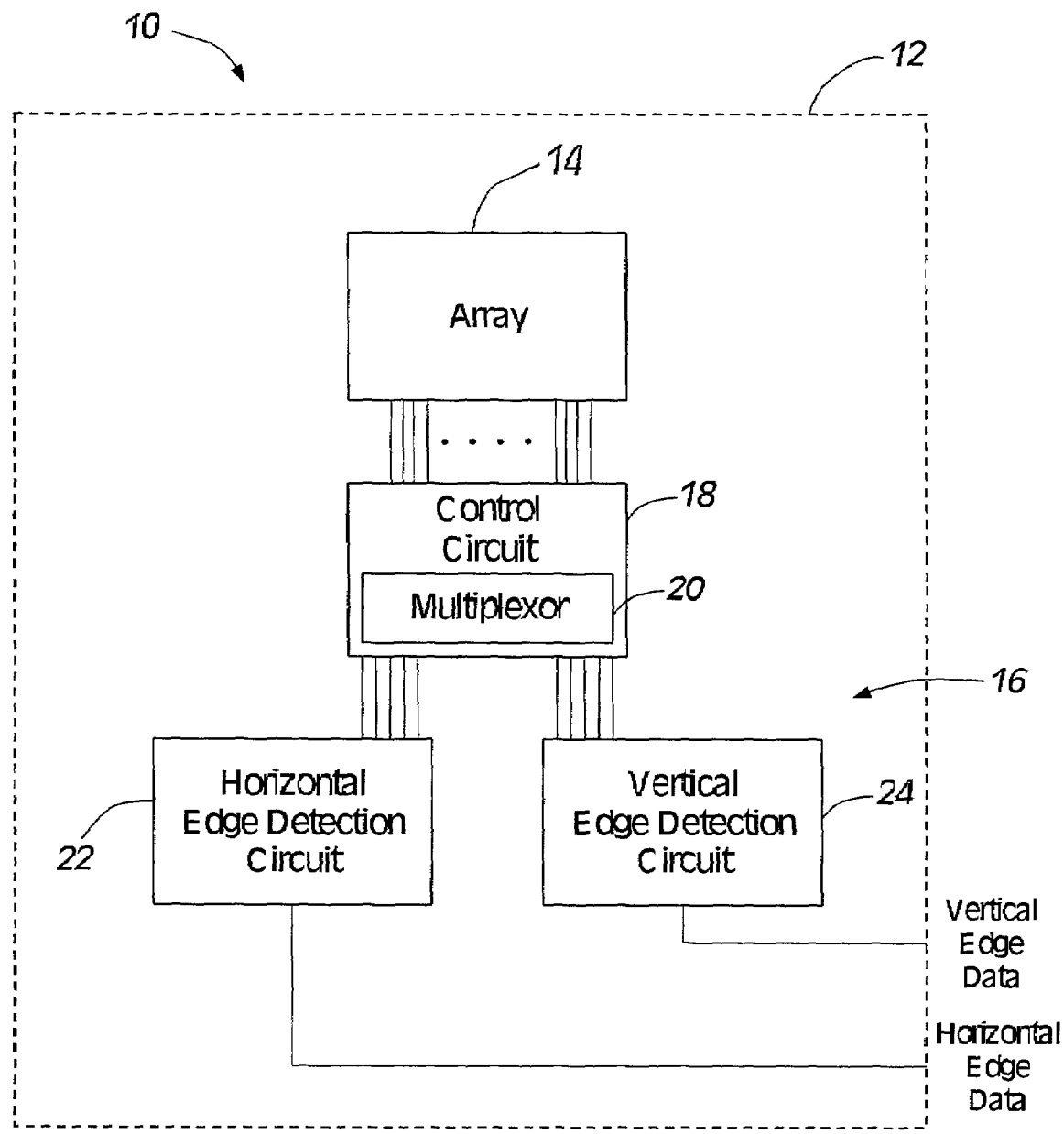
FIG. 3 is a block diagram of an image sensor constructed in accordance with the present invention.

Referring to FIG. 3, there is shown an image sensor 10 constructed in accordance with the invention. The image sensor comprises an integrated circuit chip 12 that includes both a pixel array 14 and edge detection circuitry 16 hardwired together on the chip. As used herein and as applied to filtering or other processing, "hardwired" refers to the use of analog and/or digital components that are physically wired together to carry out such processing without the use of microprocessors or other instruction-based processing devices. Pixel array 14 provides an addressable, non-destructive readout of the pixel data, with the edge detection circuit 16 providing a hardwired implementation of a pair of n×n masks that are convolved with the pixel array data to thereby generate horizontal and vertical edge data which are output by the image sensor. The masks are implemented as a pair of one-dimensional filters, with one of the filters providing a first derivative Gaussian function in the direction of interest to detect edges after first smoothing the data using the other filter in the direction orthogonal to the direction of interest. The non-destructibility of the readout from the pixel array 14 eliminates the need for buffering large amounts of pixel data and the use of separable, one-dimensional filters permits each mask to be implemented using only n simultaneous outputs from the array, 2n weights, and n−1 buffers for temporary storage of the smoothed pixel data. These and other features of the preferred embodiment will now be described below in greater detail.

In addition to the pixel array 14 and edge detection circuitry 16, image sensor 10 includes a control circuit 18 that performs the necessary addressing of the pixel array, as well as sequencing through the array to carry out the convolution of the mask with the array. This control circuit 18 also includes a multiplexor circuit 20 that simultaneously provides the n contiguous pixels from within a single row to the mask used for horizontal edge detection and the n contiguous pixels from within a single column to the mask used for horizontal edge detection. Conventional circuit designs can be used for the addressing and sequencing logic of control circuit 18. Similarly, circuit designs for implementing the multiplexor circuit 20 are well known, as are buffering circuits and various other alternative design approaches for simultaneously providing the n pixel outputs to each mask. Accordingly, no further elaboration of the details of control circuit 18 is necessary or provided herein.

Edge detection circuit 16 includes both a horizontal edge detection circuit 22 and a vertical edge detection circuit 24 that are, in essence, hardware implementations of the horizontal and vertical masks used to process the raw pixel data. Combining of horizontal and vertical edge data can be accomplished outside the chip 12 by applying a non-maximal suppression algorithm on the horizontal and vertical edge images, followed by a vector sum of the two gradients.

To avoid the need to temporarily store large amounts of pixel data, the array 14 is random access (i.e., the pixels are individually addressable) and provides a non-destructive readout of the image data from each pixel. A suitable image sensing array is disclosed in U.S. patent application Ser. No. 10/008,907, entitled "Image Sensor Method and Apparatus Having Addressable Pixels and Non-Destructive Readout," filed concurrently with this application and being commonly assigned to the assignee of this application. The complete disclosure of that application is hereby incorporated by reference. As described in that application, pixel array 14 is constructed using a CMOS process so that it can be easily integrated with the hardwired processing circuitry on the IC chip 12 without raising any of the compatibility issues that exist with buried channel CCD technology. Enhanced charge generation can be achieved using the approach disclosed in U.S. Pat. No. 6,180,937 to J. R. Troxell et al., the complete disclosure of which is hereby incorporated by reference.

The addressability of the pixels within the array 14 allows the control circuit 18 to sequentially move the masks across rows and columns of pixels and only access those pixels needed for the current pixel being processed. The non-destructibility of the pixel readouts allows the image sensing array itself to serve as a buffer. This is a significant advantage since, for example, a 5×5 mask implementing the convolution given above in equation (1) requires that each pixel be used twenty-five times.

For a mask implemented as a conventional two-dimensional filter of size n×n using $n^2$ weights w(l,m), n(n−1) local buffers would be required. In the horizontal and vertical edge detection circuits 22, 24, the number of buffers and weights is reduced to (n−1) and 2n respectively, by using a filter function that can be separated into two independent filters in which one is a function of the row locations r(l) and the other a function of the column locations c(m). That is, two filters r(l) and c(m) are used which together provide the desired n×n array of weights w(l,m):

$$w(l,m)=r(l)c(m) \qquad (5)$$

Substituting this equation into the convolution of equation (1) yields:

$$E(i, j) = \sum_{l=0}^{n-1}\sum_{m=0}^{n-1} I\left(i - \frac{n}{2} + l, j - \frac{n}{2} + m\right) \cdot r(l) \cdot c(m) \qquad (6)$$

Parallel data from the columns could be used to compute an intermediate product, S(i−n/2 +l), which would be buffered for the final computation:

$$S\left(i - \frac{n}{2} + l\right) = \sum_{m=0}^{n-1} I\left(i - \frac{n}{2} + l, j - \frac{n}{2} + m\right) \cdot c(m) \text{ for } l = 0, \ldots, n-1 \qquad (7)$$

$$E(i, j) = \sum_{l=0}^{n-1} S\left(i - \frac{n}{2} + l\right) \cdot r(l) \qquad (8)$$

The edge detection algorithm represented by equations (7) and (8) requires 2n weights and n−1 buffers. The implementation of r(l) and c(m) used by the edge detection circuits 22 and 24 will now be described, followed by a more detailed description of the construction of these circuits using a 5×5 mask size.

A two-dimensional Gaussian function can be separated into two independent functions, which provides the separability desired for implementing the two, one-dimensional filter functions r(l) and c(m). In the direction orthogonal to the direction of interest, a standard one-dimensional Gaussian filter is employed to provide localized smoothing of the pixel data. In the direction of interest, the local pixel data is convolved with a differentiated, one-dimensional Gaussian function to detect abrupt changes in light intensity that are indicative of edges within the image. More specifically, for vertical edge detection, for example, the edge detection circuit operates to smooth the localized pixel data down the columns (y-direction) and to detect edges across the rows (x-direction). The edge at (i,j) is then:

$$E(i, j) = \sum_{l=0}^{n-1}\sum_{m=0}^{n-1} I\left(i - \frac{n}{2} + l, j - \frac{n}{2} + m\right) \cdot G(m, \sigma) \cdot G'(l, \sigma) \quad (9)$$

G(m,σ) is the one-dimensional Gaussian function used for smoothing, and G'(l,σ) is the Gaussian derivative used for edge detection. In the vertical edge detection circuit 24, the n pixel values simultaneously output by the array 14 from any particular column are smoothed to produce n intermediate values S(i−n/2+l) according to the equation:

$$S\left(i - \frac{n}{2} + l\right) = \sum_{m=0}^{n-1} I\left(i - \frac{n}{2} + l, j - \frac{n}{2} + m\right) \cdot G(m, \sigma) \text{ for } l = 0, \ldots, n-1 \quad (10)$$

The first n−1 of these intermediate data values are then inserted into a buffer and held until the circuit is done computing equation (10) for each value of l. Thereafter, the differencing function is applied to the set of smoothed pixel data contained in the buffers and the results are summed to compute E(i,j), as follows:

$$E(i, j) = \sum_{l=0}^{n-1} S\left(i - \frac{n}{2} + l\right) \cdot G'(l, \sigma) \quad (11)$$

For the horizontal edge detection circuit 22, the edge at (i,j) now becomes:

$$E(i, j) = \sum_{m=0}^{n-1}\sum_{l=0}^{n-1} I\left(i - \frac{n}{2} + l, j - \frac{n}{2} + m\right) \cdot G(l, \sigma) \cdot G'(m, \sigma) \quad (12)$$

and the intermediate (smoothing) and final (differencing) functions become:

$$S\left(j - \frac{n}{2} + m\right) = \sum_{l=0}^{n-1} I\left(i - \frac{n}{2} + l, j - \frac{n}{2} + m\right) \cdot G(l, \sigma) \text{ for } m = 0, \ldots, n-1 \quad (13)$$

$$E(i, j) = \sum_{m=0}^{n-1} S\left(j - \frac{n}{2} + m\right) \cdot G'(m, \sigma) \quad (14)$$

Figure 4:
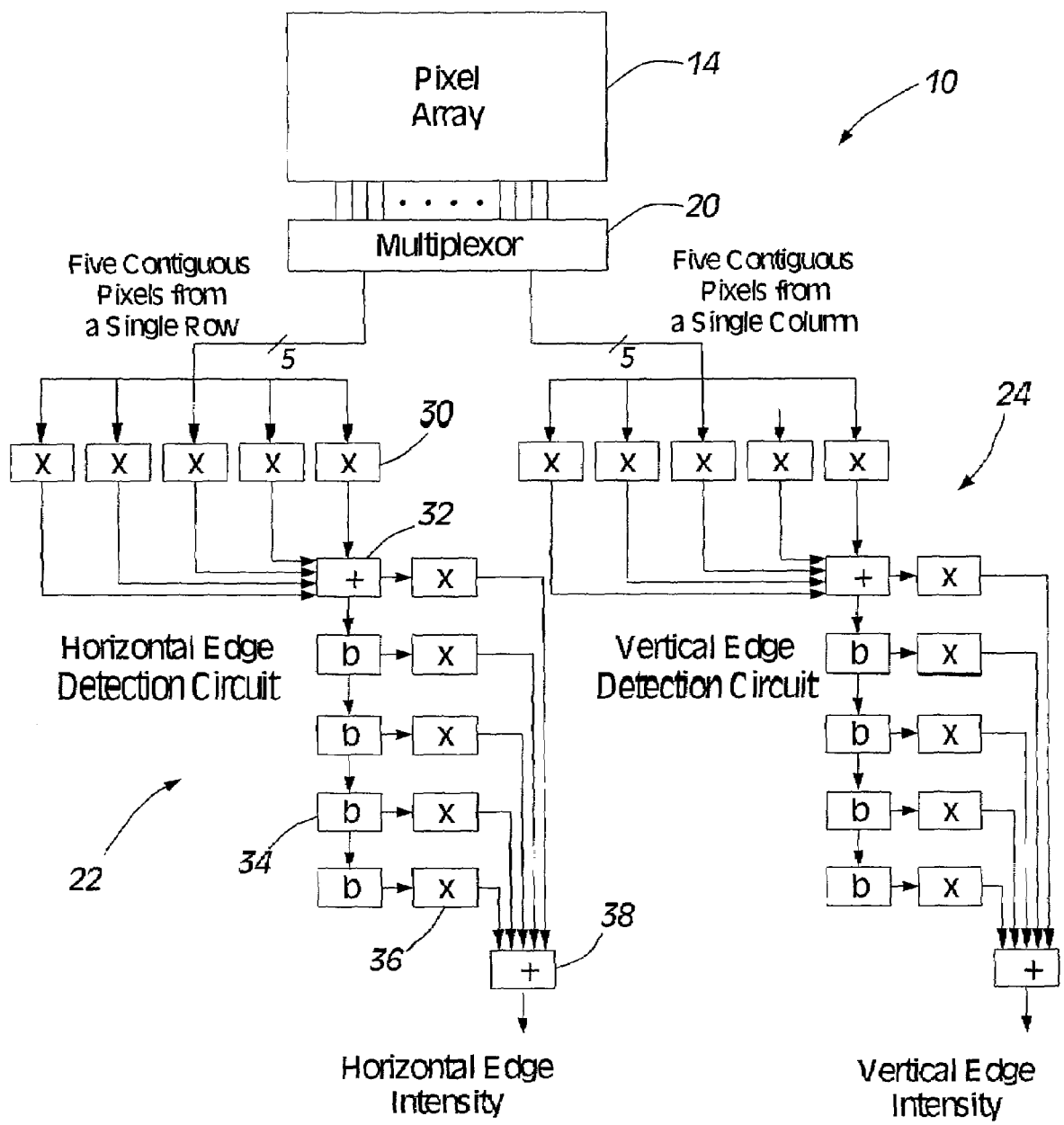
FIG. 4 is a block diagram depicting the integral edge detection circuitry used in the image sensor of FIG. 3.

Referring now to FIG. 4, the edge detection circuit 16 will now be described in greater detail as it would be used to implement equations (10), (11) and (13), (14) via a pair of 5×5 masks. As mentioned above, multiplexor circuit 20 simultaneously outputs n (five) contiguous pixels from a single row for use by horizontal edge detection circuit 22 and five contiguous pixels from a single column for use by vertical edge detection circuit 24. For circuit 22, the five pixels from within a row are each multiplied by their corresponding filter coefficient, or weight, as indicated by the multiplication circuits 30, and the products are summed together, as indicated by the addition circuit 32. The filter coefficients are selected so as to provide the Gaussian smoothing function G(l,σ) that results in the intermediate output data defined in equation (13). After each of the first four sets of pixels are smoothed, they are shifted down into the buffers 34 for temporary storage. Once all five rows have been smoothed, the filtered (smoothed) row data is applied to a differencing function; namely, the one-dimensional, first derivative Gaussian function G'(m,σ). This is accomplished by multiplying the filtered data in each of the buffers 34 (and at the summing node 32) with suitable weights, as indicated by the multiplication circuits 36. The products of this multiplication are then summed, as indicated by equation (14) and the addition circuit 38. As shown in FIG. 4, this same approach is used for the vertical edge detection circuit 24, with the exception that, as indicated by equations (10) and (11), the pixel data is smoothed in the vertical direction and edges detected by applying the differencing function in the horizontal direction.

As will be understood by those skilled in the art, the pixel data accessed from each pixel element of array 14 and provided by multiplexor circuit 20 to the edge detection circuit 16 is in the form of an analog signal that is indicative of a portion of the image sensed by that pixel element. In particular, the analog signal has a magnitude representative of the intensity of the light received by that pixel. To carry out multiplication of those signals by the Gaussian filter weights, switch-capacitor multiplying circuits are used for the multiplication circuits 30 and 36 of FIG. 4.

Figure 5:
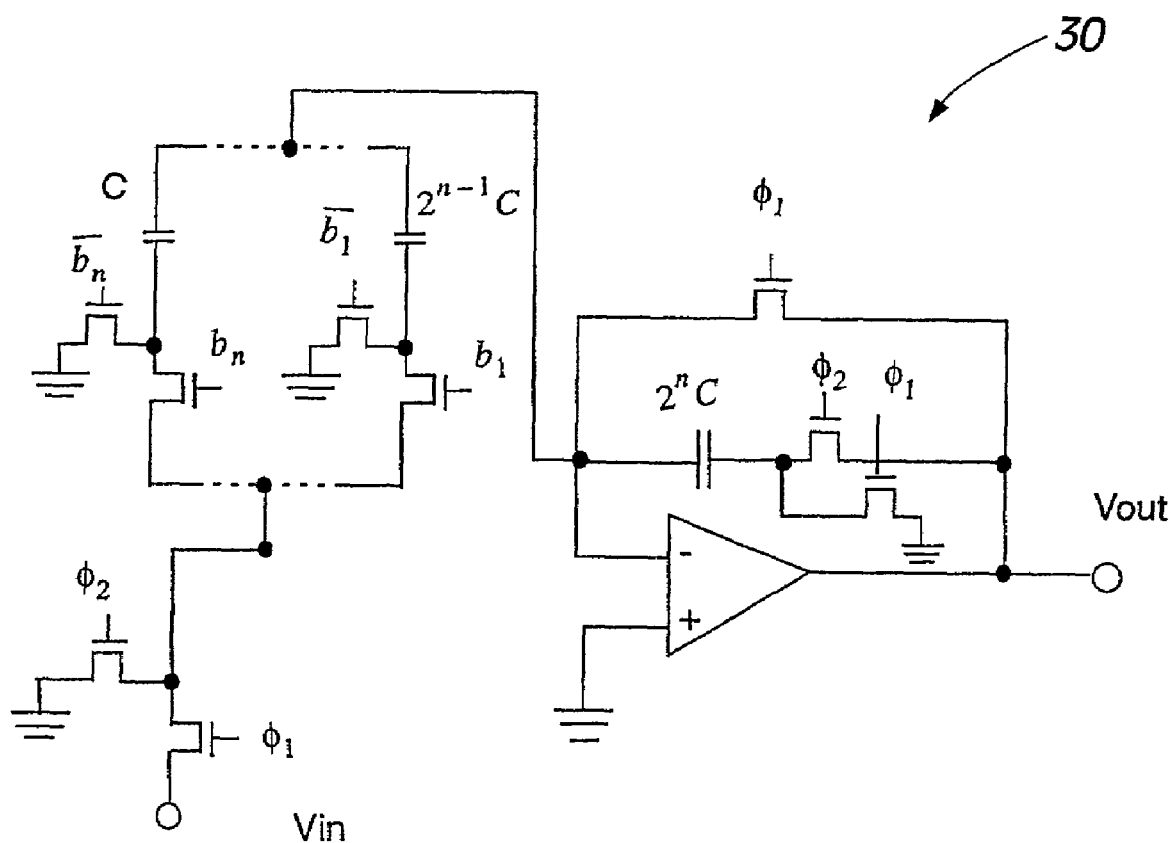
FIG. 5 is a schematic of a switched capacitor multiplier circuit used in the image sensor of FIG. 3.

Turning now to FIG. 5, one such switched-capacitor multiplying circuit is shown. Although the construction and operation of these circuits is well known for such uses as active filters, a brief description of their use in implementing the edge detection circuits will now be given. Signals $\phi_1$ and $\phi_2$ are non-overlapping clock signals, and signals $b_i$ represent the binary weights. Vin is the analog pixel voltage value to be multiplied by the constant, and Vout is this stage's result. The weighting is accomplished using different capacitance values, with larger values of the unit multiple C corresponding to smaller binary weights. Multiplication by a negative binary number is accomplished by interchanging $\phi_1$ and $\phi_2$ in the input stage. Multiplication by a bipolar input signal is accomplished by including a sign bit that selects the ordering of the two clock signals.

As will be appreciated, the combination of an addressable, nondestructive readout sensor and the first derivative Gaussian edge filters is easily extended to provide edge detection, in both horizontal and vertical directions, in the entire image at the frame readout speed with only eight buffers needed for a 5×5 edge mask.

It will thus be apparent that there has been provided in accordance with the present invention an image sensor with hardware implemented edge detection processing which achieves the aims and advantages specified herein. It will of course be understood that the foregoing description is of a preferred exemplary embodiment of the invention and that the invention is not limited to the specific embodiment shown. Various changes and modifications will become apparent to those skilled in the art. For example, an n×m mask could be used with concomitant changes being made to the control circuit 18 and edge detection circuits 22, 24. All such variations and modifications are intended to come within the scope of the appended claims.

We claim:

1. A method for detecting edges in an image using an image sensor that comprises a two-dimensional array of addressable pixels, with each of said pixels providing a data value indicative of a portion of the image sensed by that pixel, the method comprising the steps of:
   (a) sensing the image using the image sensor; and
   (b) carrying out the following steps for each of a number of selected pixels using a two-dimensional localized group of pixels surrounding each selected pixel, wherein each of the localized groups of pixels comprises a plurality of one-dimensional sets of pixels, each one-dimensional set being orthogonally offset from the other one-dimensional sets in the group:
      (b1) accessing a one-dimensional set of pixels contained within the localized group of pixels;
      (b2) reading the data values associated with the pixels accessed in step (b1);
      (b3) determining an intermediate data value using a smoothing function that is applied to the data values read in step (b2);
      (b4) repeating steps (b1) through (b3) for each of the one-dimensional sets of pixels contained within the localized group to thereby produce a set of said intermediate data values; and
      (b5) determining a final data value for the selected pixel using a differencing function that is applied to the set of intermediate data values;
   wherein step (b) further comprises processing the selected pixels sequentially such that, for each selected pixel, steps (b1) through (b5) are carried out for that selected pixel prior to carrying out any of the steps (b1) through (b5) for the next selected pixel.

2. The method of claim 1, wherein step (b) further comprises detecting edges in a first one of the dimensions of said array and wherein the one-dimensional set of pixels used in step (b1) comprises a set of pixels extending in the second dimension of said array.

3. The method of claim 2, further comprising to step of(c) detecting edges in the second dimension of said array by carrying out the following steps for each of a number of selected pixels using a localized group of pixels surrounding each selected pixel:
   (c1) accessing a one-dimensional set of pixels that are contained within the localized group of pixels and that extend in the first dimension;
   (c2) reading the data values associated with the pixels accessed in step (c1);
   (c3) determining an intermediate data value using a smoothing function that is applied to the data values read in step (c2);
   (c4) repeating steps (c1) through (c3) for each of the one-dimensional sets of pixels contained within the localized group to thereby produce a set of said intermediate data values;
   (c5) determining a final data value for the selected pixel using a differencing function that is applied to the set of intermediate data values.

4. The method of claim 1, wherein said smoothing function comprises a one-dimensional Gaussian function.

5. The method of claim 1, wherein said differencing function comprises a one-dimensional, first derivative Gaussian function.

6. The method of claim 1, wherein the smoothing function comprises a set of weights and wherein step (b3) further comprises:
   determining a number of multiplication products by multiplying each data value wit an associated one of said weights, and
   determining the intermediate data value by summing together the multiplication products.

7. The method of claim 1, further comprising carrying out steps (b1) through (b5) using hardwired circuitry formed on a single chip that includes the image sensor.

8. The method of claim 1, wherein step (a) further comprises sensing and recording the image using an image sensor having a non-destructive readout, and wherein step (b) further comprises carrying out steps (b1) through (b5) for each of a number of adjacent pixels, whereby the data value recorded by at least some of said pixels is read out more than once.

9. The method of claim 1, wherein step (b) further comprises carrying out steps (b1) through (b5) by buffering of at least some of said intermediate data values and without buffering of the data values read in step (b2).

10. An image sensor for use in sensing an image and outputting image data that identifies edges contained within the image, comprising:
    an array of addressable pixels, each of which provides a non-destructive readout of an analog signal indicative of a portion of the image sensed by that pixel; and
    an edge detection circuit comprising:
       a smoothing filter circuit connected to said array, said smoothing filter circuit having an output for supplying filtered output data and having one or more inputs for receiving a plurality of the analog signals from said pixels; and
       a differencing filter circuit having an input coupled to the output of said smoothing filter circuit to receive the filtered output data, said differencing filter circuit having an output for supplying image data that identifies edges contained within the image.

11. An image sensor as defined in claim 10, wherein at least one of said filter circuits comprises one or more switched-capacitor multiplying circuits.

12. An image sensor as defined in claim 11, wherein said smoothing filter circuit includes n switched-capacitor multiplying circuits, each of which has an input connected to said array to simultaneous receive n analog signals from n different pixels in said array, and wherein said switched-capacitor multiplying circuits include one or more binary weights.

13. An image sensor as defined in claim 10, wherein said differencing filter circuit includes a plurality of buffers for temporary storage of the filtered output data provided by said smoothing filter circuit.

14. An image sensor as defined in claim 10, wherein said smoothing filter circuit is connected to said array via a multiplexor circuit that accesses different sets of pixels from said array and provides the analog signals from the accessed pixels to said smoothing filter.

15. An image sensor as defined in claim 10, wherein said edge detection circuit comprises a horizontal edge detection circuit having a plurality of said inputs connected to said array to simultaneously receive analog signals from different pixels located in any single row of said array.

16. An image sensor as defined in claim 15, further comprising a control circuit connected to said array to provide said horizontal edge detection circuit with analog signals from different groups of contiguous pixels located within any single row of said array and to sequentially provide said horizontal edge detection circuit with analog signals from the same group of pixels located within contiguous rows of said array.

17. An image sensor as defined in claim 15, further comprising a vertical edge detection circuit having a second plurality of said inputs connected to said array to simultaneously receive analog signals from different pixels located in any single column of said array.

18. An image sensor as defined in claim 17, further comprising a control circuit connected to said array to provide said horizontal edge detection circuit with analog signals from different groups of contiguous pixels located within any single row of said array and to sequentially provide said horizontal edge detection circuit with analog signals from the same group of pixels located within contiguous rows of said array; and wherein said control circuit is further operable to provide said vertical edge detection circuit with analog signals from different groups of contiguous pixels located within any single column of said array and to sequentially provide said vertical edge detection circuit with analog signals from the same group of pixels located within contiguous columns of said array.

19. An image sensor as defined in claim 10, further comprising a control circuit for selectively providing analog signals from different pixels to said smoothing filter, wherein said smoothing filter circuit and said differencing filter circuit together comprise a mask and wherein said control circuit is operable to convolve said mask with said array to thereby output the image data for each of number of different pixels in said array.

20. An image sensor as defined in claim 10, wherein said array and edge detection circuit together comprise a single integrated circuit.

21. An image sensor as defined in claim 10, wherein said smoothing filter circuit comprises a one-dimensional Gaussian filter.

22. An image sensor as defined in claim 21, wherein said differencing filter circuit comprises a one-dimensional, first derivative Gaussian filter.

23. A method for detecting edges in an image using an image sensor that comprises a two-dimensional array of pixels, with each of said pixels providing a data value indicative of a portion of the image sensed by that pixel, the method comprising the steps of:

providing a mask that comprises a one-dimensional Gaussian function applied to groups of the image data values in a first direction to thereby produce intermediate data values that each represent a combination of the image data values contained in one of said groups, said mask further comprising a separate one-dimensional, first derivative Gaussian function applied to sets of the intermediate data values; and convolving the mask with the image to produce edge data for each of a number of selected pixels.

24. The method of claim 23, further comprising the steps of:

providing a second mask that comprises a one-dimensional Gaussian function applied to additional groups of the image data values in the second direction to thereby produce additional intermediate data values that each represent a combination of the image data values contained in one of said additional groups, said mask further comprising a separate one-dimensional, first derivative Gaussian function applied to sets of the additional intermediate data values: and convolving the second mask with the image to produce edge data for each of a number of selected pixels.

25. The method of claim 24, further comprising the step of combining together the edge data obtained as a result of convolving the first and second masks.

26. The method of claim 24, further comprising carrying out each of the steps using an image sensor having a non-destructive readout and using hardwired circuitry formed on a single chip that includes the image sensor.

* * * * *